United States Patent [19]

Watanabe et al.

[11] Patent Number: 5,285,488
[45] Date of Patent: Feb. 8, 1994

[54] EXPOSURE APPARATUS

[75] Inventors: Yutaka Watanabe, Isehara; Ryuichi Ebinuma, Kawasaki; Nobutoshi Mizusawa, Yamato; Shunichi Uzawa, Tokyo; Takao Kariya, Hino, all of Japan

[73] Assignee: Canon Kabushiki Kaisha, Tokyo, Japan

[21] Appl. No.: 974,307

[22] Filed: Nov. 10, 1992

Related U.S. Application Data

[63] Continuation of Ser. No. 591,769, Oct. 2, 1990, abandoned.

[30] Foreign Application Priority Data

Oct. 3, 1989 [JP] Japan .................. 1-257075
Oct. 3, 1989 [JP] Japan .................. 1-257076

[51] Int. Cl.⁵ .............................. G21K 5/00
[52] U.S. Cl. .......................... 378/34; 378/151
[58] Field of Search ................... 378/34, 151

[56] References Cited

U.S. PATENT DOCUMENTS

| | | | |
|---|---|---|---|
| 4,748,646 | 5/1988 | Osada | 378/34 |
| 4,803,712 | 2/1989 | Kembo et al. | 378/34 |
| 4,916,723 | 4/1990 | Geluk | 378/146 |

FOREIGN PATENT DOCUMENTS

| | | | |
|---|---|---|---|
| 83394 | 7/1983 | European Pat. Off. | |
| 083394 | 7/1983 | European Pat. Off. | 378/34 |
| 109193 | 5/1984 | European Pat. Off. | 378/34 |
| 56-33633 | 4/1981 | Japan . | |
| 56-104438 | 8/1981 | Japan | 378/34 |
| 60-7722 | 1/1985 | Japan . | |
| 62-204527 | 9/1987 | Japan . | |
| 62-223822 | 10/1987 | Japan . | |
| 63-020730 | 1/1988 | Japan . | |
| 1-243519 | 1/1989 | Japan | 378/34 |
| 1-169745 | 7/1989 | Japan . | |
| 2126740 | 3/1984 | United Kingdom . | |
| 2154023 | 8/1985 | United Kingdom . | |

Primary Examiner—Craig E. Church
Attorney, Agent, or Firm—Fitzpatrick, Cella, Harper & Scinto

[57] ABSTRACT

An exposure apparatus includes an exposure beam source for projecting a beam flux for exposure, having a non-uniform intensity distribution, toward a range including an exposure zone, set with respect to a main body of the exposure apparatus; illuminance detectors disposed at least at two points inside the exposure beam flux but outside the exposure zone; and a detecting device for detecting a change in intensity of the exposure beam and a change in relative position of the exposure zone and the exposure beam flux, on the basis of detected illuminances at the two points.

22 Claims, 15 Drawing Sheets

EXPOSURE APPARATUS

This application is a continuation of application Ser. No. 07/591,769 filed Oct. 2, 1990, now abandoned.

FIELD OF THE INVENTION AND RELATED ART

This invention relates to an exposure apparatus for lithographically transferring an image of an original such as a mask onto a workpiece to be exposed, such as a wafer, at high precision.

Recently, the degree of integration of a semiconductor integrated circuit is increasing more and more, and as for an exposure apparatus (aligner) for manufacture of the same, one having higher transfer precision is required. As an example, for an integrated circuit of 256 megabit DRAM, an exposure apparatus capable of printing a pattern of a linewidth on an order of 0.25 micron is necessary.

As an exposure apparatus for such ultra-fine pattern printing, a proximity exposure apparatus which uses synchrotron orbit radiation (SOR X-rays) has been proposed.

Since the SOR light comprises a sheet-like beam which is uniform in the horizontal direction, the following methods have been proposed to allow exposure of a surface area:

(1) A scan exposure method in which a mask and a wafer are moved vertically so that their surfaces are scanned with X-rays of a sheet beam shape, elongated horizontally;

(2) A scan mirror exposure method in which X-rays of a sheet beam shape are reflected by a swinging mirror so as to scan a mask and a wafer vertically; and (3) A simultaneous exposure method in which X-rays of a sheet beam shape elongated horizontally are divergently reflected, with respect to the vertical direction, by means of an X-ray mirror having a reflection surface machined into a convex shape, so that the X-rays are projected simultaneously to the whole exposure zone.

An example of an X-ray exposure apparatus according to such a simultaneous exposure method has been proposed in Japanese Laid-Open Patent Application, Laid-Open No. 1-243519.

In this type of X-ray exposure apparatus, the X-rays (light to be used for the exposure) have a uniform intensity (illuminance) with respect to the horizontal direction (hereinafter "x-axis direction"). However, with regard to the vertical direction (hereinafter "y-axis direction"), there is a non-uniformness in intensity such as depicted by an illuminance distribution curve $1i$ in FIG. 15A, for example, wherein the intensity is high at the middle portion and it decreases with spacing therefrom upwardly and downwardly (y-axis direction). In the aforementioned Japanese Patent Application, two blocking plates each having a rectangular opening (shutter aperture) are used and their moving speeds in the y-axis direction are controlled independently of each other, such as depicted by profiles $1a$ and $1b$ in FIG. 15B, to thereby control the amount of exposure at each portion of the exposure zone in the manner as depicted by a solid line $1T$ in FIG. 15C. More specifically, with regard to each portion in the y-axis direction, the time from a start of transmission of the exposure light (X-rays) responsive to the passage of a leading edge of the aperture of a first blocking plate until the interception of the exposure light responsive to the passage of a trailing edge of the aperture of a second blocking plate, is controlled so as to attain correct and uniform exposure on the whole exposure zone. In this case, the control of the exposure amount is based on the X-ray intensity distribution curve (hereinafter "profile") $1i$ with respect to the y-axis direction, such as depicted in FIG. 15A, as measured in the exposure zone.

SUMMARY OF THE INVENTION

As a result of investigations having been made in relation to this type of X-ray exposure apparatus, for further enhancement of the transfer precision, the inventors of the subject application have found that a change in the relative position of the exposure zone and the X-ray flux has a non-negligible affect on the transfer precision.

For example, if the X-ray flux displaces by $\Delta y$ and thus the profile displaces by $\Delta y$, from the solid line position (profile $1i$) to the broken line position (profile $2i$) in FIG. 15A, then the X-ray intensity I at the position y changes by $\Delta y(dI/dy)$. Accordingly, in order to hold the change in intensity I not greater than 0.1%, the following relation should be satisfied:

$$\Delta y < I/10000 \cdot 1/(dI/dy) = 1/1000 \cdot 1/[(dI/I)/dy]$$

More particularly, assuming now that the field angle dimension of the exposure zone in the y-axis direction is 30 mm, that the profile $1i$ as depicted by the solid line in FIG. 15A is represented by a quadratic function which is vertically symmetrical with respect to the center line and that the lowest intensity is 80% of the highest intensity, then the following relation is obtained:

$$\Delta y < 1/1000 \cdot 1/(0.4/15) \approx 0.04 \text{ mm}$$

Thus, in order to hold the non-uniformness in X-ray intensity not greater than 0.1%, the relative positional change $\Delta y$ of the X-ray flux with respect to the exposure zone has to be held not greater than 40 microns.

Also, in the proximity exposure method, a change in the angle of incidence of illumination light causes deterioration of the registration precision. If, for example, the proximity gap G between a mask and a wafer is 50 microns, then in order that the registration error $\Delta\delta$ due to the change in the angle of incidence is held not greater than 0.002 micron, the change $\Delta\theta$ in the angle of incidence should satisfy the following relation:

$$\Delta\theta = \Delta\delta/G < 0.002/50 = 4 \times 10^{-5} \text{ rad.}$$

Namely, it should be not greater than $4 \times 10^{-5}$ rad.

Also, when the illumination light has a divergent angle, the angle of incidence of the X-rays to the exposure zone changes with the relative positional change $\Delta y$. If the interval between the point of divergence (e.g. the position of incidence of the X-rays upon the X-ray diverging convex mirror) and the surface area to be exposed is 5 m, then the quantity $\Delta\theta$ of the change in the angle of incidence is:

$$\Delta\theta = \Delta y/5000$$

Such a change $\Delta\theta$ in the angle of incidence causes a registration error (runout error) $\Delta\delta$ between the mask and the wafer, which can be given by:

$$\Delta\delta = \Delta\theta \cdot G$$

wherein G is the proximity gap between the mask and the wafer. Thus, if the gap G is 50 microns, then in order to hold the registration error $\Delta\delta$ not greater than 0.002 micron, the following relation should be satisfied:

$$\Delta\theta < 0.002/50 = 4 \times 10^{-5} \text{ rad}$$

That is, $$\Delta y = 5000 \cdot \Delta\theta < 0.2 \text{ mm}$$

Here, predicted factors for the change $\Delta y$ are: one attributable to a change in attitude of the exposure apparatus resulting from movement of a wafer stage (about 200 microns); a relative displacement resulting from a temperature change (about 10 microns); a relative displacement resulting from vibration of the floor (about 2 microns); and the like.

It is accordingly an object of the present invention to provide an exposure apparatus by which a registration error $\Delta\delta$ attributable to a change $\Delta\theta$ in the angle of incidence as described and/or a change $\Delta y$ in the relative position as described, can be reduced by which further enhancement of the transfer precision is attained.

In accordance with an aspect of the present invention, to achieve the above object, there is provided an exposure apparatus, comprising: exposure amount controlling means adapted to set an exposure time distribution corresponding to non-uniformness of illumination light in a one-dimensional direction, so as to provide a uniform exposure amount over an exposure zone; and positional reference controlling means operable to shift a positional reference for said exposure amount controlling means, in the one-dimensional direction, with respect to a frame of said exposure apparatus.

In one preferred form of this invention, said exposure amount controlling means includes shutter means having a light blocking plate, and driving means for driving said light blocking plate in accordance with a drive curve corresponding to the non-uniformness of intensity, while said positional reference controlling means is operable to shift a reference of the drive curve.

In another preferred form of this invention, a portion of the shutter means including a light blocking plate is formed into a unit structure, and such shutter unit is moved in the one-dimensional direction relative to the frame of the exposure apparatus or, alternatively, it is rotationally moved about the optical axis of the illumination light.

The positional reference can be adjusted in accordance with a signal obtained, for example, by detecting a relative change in attitude between the main body of the exposure apparatus, including the frame, and a floor on which an illumination system including an SOR device (exposure light source) is disposed.

In the above-described structure, if the positional reference controlling means shifts the positional reference for the exposure amount controlling means with respect to the frame of the exposure apparatus, then the exposure time distribution of the illumination light in the exposure zone is shifted. Thus, by detecting the relative positional change $\Delta y$ between the illumination light and the exposure zone and then by shifting the positional reference in accordance with a corresponding detection signal to shift the exposure time distribution, it is possible to compensate for the non-uniformness in exposure resulting from the positional change $\Delta y$.

Further, in an arrangement where the positional reference is shifted by relatively shifting the main body of the exposure apparatus and the illumination system, there is an additional advantage that the registration error attributable to the positional change $\Delta y$ can be reduced.

It is a second object of the present invention to provide an exposure apparatus by which any change in the relative position of the exposure zone and the light flux for exposure as well as any change in intensity of the exposure light can be detected in a real-time fashion or like it, by which further enhancement of the transfer precision is attained.

In accordance with an aspect of the present invention, to achieve this object, there is provided an exposure apparatus in which a flux of light to be used for exposure, having a non-uniform intensity distribution, is projected toward a range including an exposure zone, set with respect to a main body of the exposure apparatus, wherein illuminance detectors are disposed at least at two points inside the exposure light flux but outside the exposure zone and wherein, on the basis of detected illuminances at the two points, a change in intensity of the exposure light and a change in relative position of the exposure zone and the exposure light flux are detected.

The result of detection of the change in the relative position can be used for various purposes examples of which are: to shift a light blocking plate drive table, for memorization of the state of drive of the shutter blocking plate, so as to attain uniformness in the amount of exposure at various portions of the exposure zone; to adjust the attitude of the shutter unit; to adjust the attitude of the main body of the exposure apparatus; to adjust the attitude of an X-ray mirror when the exposure light comprises SOR X-rays; to adjust the electron orbit in an SOR device used as a source of exposure light; and the like.

In the above-described structure, illuminance detectors are disposed at least at two points inside the exposure light flux having non-uniformness in intensity. As a result, for all the detectors, the change in intensity of the exposure light can be detected as an illuminance change component of the same proportion. However, for all the detectors, the change in the relative position of the exposure light flux and the exposure zone is detected as an illuminance change component of different proportions. Thus, by discriminating these components, it is possible to detect the change in intensity of the exposure light as well as the change in the relative position of the exposure light flux and the exposure zone.

Further, since each detector is disposed outside the exposure zone, it does not interfere with the exposure operation. Thus, it is possible to detect the change in intensity of the exposure light as well as the change in the relative position of the exposure light and the exposure zone, at any desired timing or in the real-time fashion.

A particular example will now be explained. It is now assumed that, relative to a source of exposure light having a profile such as depicted in FIG. 3, first and second illuminance detectors are disposed at points A and B, respectively, and that the outputs of the first and second detectors A and B at time $t=0$ are denoted by $I_{A0}$ and $I_{B0}$, respectively. If the outputs of the first and second detectors A and B at time $t=t$, after the profile has changed by $\Delta y$ and the intensity of the exposure light has changed (attenuated) by $f(t)$, are denoted by $I_A$ and $I_B$, respectively, then, by linear approximation with respect to $\Delta y$, the following relations are provided:

$$I_A = (I_{A0} + k_A \Delta y) f(t) \quad (1)$$

$$I_B = (I_{B0} + k_B \Delta y) f(t) \quad (2)$$

wherein $$k_A = -\left.\frac{dI}{dy}\right|_{y=A}$$

$$k_B = -\left.\frac{dI}{dy}\right|_{y=B}$$

Solving equations (1) and (2), it follows that:

$$f(t) = (1/D)(k_B I_A - k_A I_B) \quad (3)$$

$$\Delta y = 1/f(t) \cdot (1/D)(I_{A0} I_B - I_{B0} I_A) \quad (4)$$

wherein,
$$D = I_{A0} k_B - I_{B0} k_A$$

If $D=0$, both of $f(t)$ and $\Delta y$ are indeterminate.

The above solutions can be rewritten as follows:

$$f(t) = [1/(\alpha - \beta)](\alpha i_A - \beta i_B) \quad (5)$$

$$\Delta y = 1/f(t) \cdot [\alpha \beta/(\alpha - \beta)](i_B - i_A) \quad (6)$$

wherein,
$\alpha = I_{A0}/k_A$, $\beta = I_{B0}/k_B$, $i_A = I_A/I_{A0}$ and $i_B = I_B/I_{B0}$.

From this, it is seen that the attenuation $f(t)$ attributable to the time of the exposure light flux can be detected with weighted mean, while the change $\Delta y$ in the relative position of the exposure light flux and the exposure zone can be detected as a difference.

In accordance with this aspect of the present invention, as described, it is possible to detect a change in intensity of the exposure light as well as a change in relative position of the exposure light flux and the exposure zone, both at a desired time.

Thus, by adjusting the exposure time in accordance with the change in intensity of the exposure light, it is possible to control the amount of exposure in the real-time fashion and, therefore, it is possible to avoid degradation of transfer precision attributable to a change in exposure amount resulting from a change in intensity of the exposure light.

Further, by using a detection output related to the relative positional change between the exposure light flux and the exposure zone, a light blocking plate drive table for memorization of the state of drive of the shutter blocking plate may be shifted, the attitude of the shutter unit may be adjusted, the attitude of the main body of the exposure apparatus may be adjusted, the attitude of the X-ray mirror may be adjusted, or the electron orbit in the SOR device may be adjusted, for corrective control of the exposure condition on the exposure zone. By doing so, the state of exposure can be held optimum, continuously, and as a result further enhancement of the transfer precision is attainable.

Also, the frequency of profile measurement in the exposure zone may be decreased to improve the throughput of the apparatus.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 15A–15C are graphs, respectively, for explaining the operation of an aligner of the present invention, wherein FIG. 15A shows an illumination intensity distribution (profile), FIG. 15B shows a shutter drive curve and FIG. 15C shows an exposure time distribution.

DESCRIPTION OF THE PREFERRED EMBODIMENTS

Figure 1:
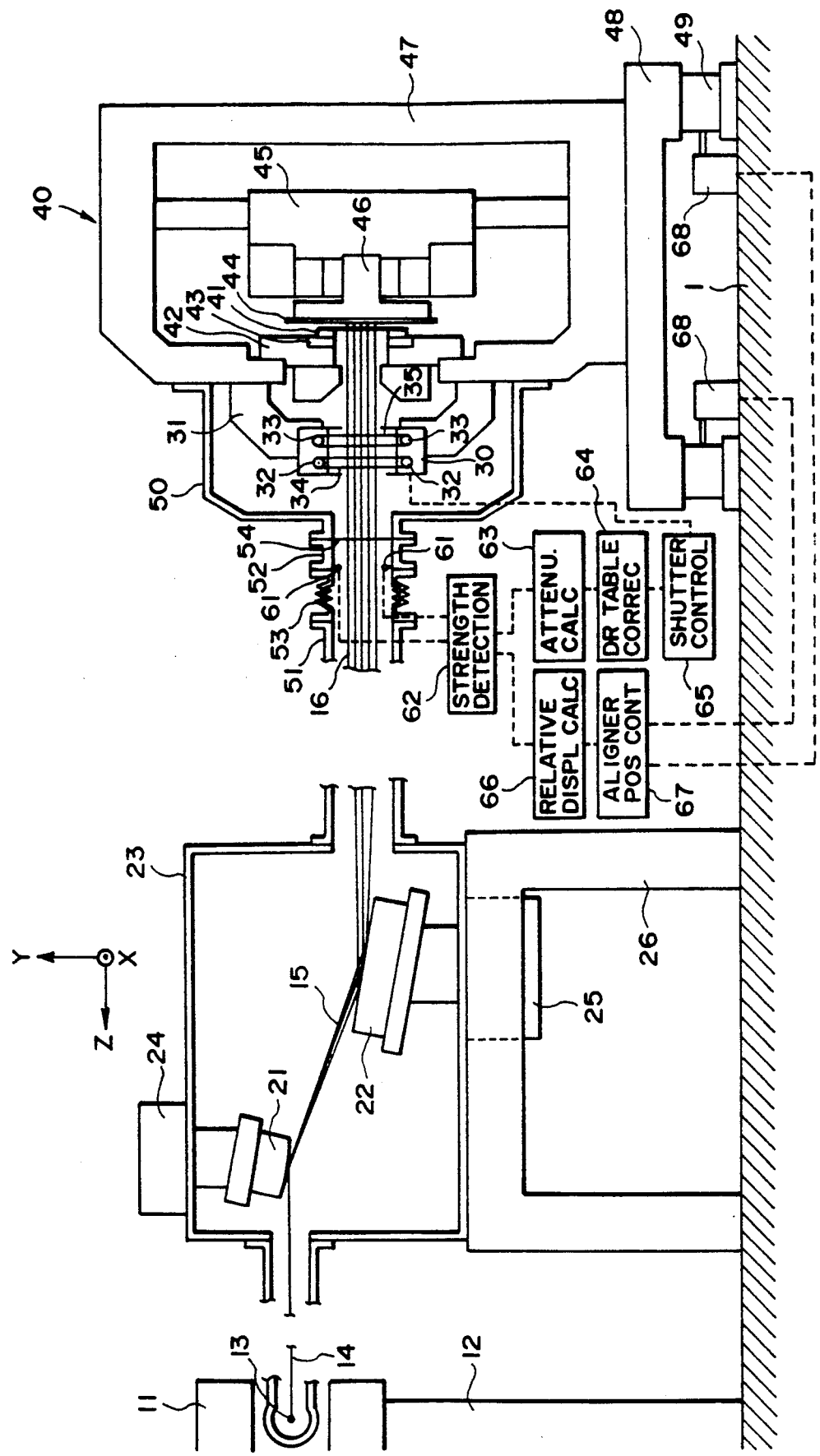
FIG. 1 is a schematic and diagrammatic view of an X-ray aligner according to an embodiment of the present invention.

Referring to FIG. 1 showing an X-ray aligner according to an embodiment of the present invention, reference numeral 11 denotes an SOR device which is placed on a table 12 and which is adapted to emit X-rays 14 from an emission point 13. Denoted at 21 is a first mirror having a convex-shaped reflection surface for expanding the flux of SOR X-rays 14, having a shape of a sheet beam elongated in the x-axis (horizontal) direction, in the y-axis (vertical) direction. Denoted at 22 is a second mirror for reflecting the X-ray flux 15, divergently emanating from the first mirror 21, so that its central axis extends horizontally (z-axis direction). The X-ray flux reflected by the second mirror 22 is inputted to an aligner main body 40 as illumination light 16.

Denoted at 23 is a mirror chamber for surrounding the first mirror 21 and the second mirror 22 with a desired vacuum ambience; at 24 is a first mirror driving device which is used for adjustment of the attitude of the first mirror 21; at 25 is a second mirror driving device which is used for adjustment of the attitude of the second mirror 22; and at 26 is a mirror support.

Denoted at 30 is a shutter unit which comprises a shutter stay 31 and shutter shafts 32 and 33 mounted to the stay 31 as well as shutter films 34 and 35 which are stretched between the shutter shafts 32–32 and between the shutter shafts 33—33, respectively. The shutter films 34 and 35 are provided by endless steel belts with rectangular openings (not shown) having sides each being longer than the size of the exposure zone with respect to the y-axis direction.

Denoted at 41 is a mask on which a pattern, to be transferred, is formed by using an X-ray non-transmissible material such as gold; at 42 is a movable mask stage for carrying thereon the mask 41; at 43 is a mask chuck for holding the mask 41 on the mask stage 42; at 44 is a wafer onto which an image of the mask 41 is to be transferred; at 45 is a movable wafer stage for carrying thereon the wafer 44 and being movable in the x-axis and y-axis directions; at 46 is a wafer chuck for holding the wafer 44 on the wafer stage 45; at 47 is an aligner frame to which the mask stage 42 and the wafer stage 45, for example, are mounted; at 48 is an aligner base on which the aligner frame 47 is placed; and at 49 are air springs for supporting the aligner base 48 on a floor 1. The aligner base 48 is supported at least at three points by means of at least three air springs 49.

Denoted at 50 is a helium chamber for surrounding the shutter unit 30, the mask 41 placed on the mask stage 42 and the wafer 44 placed on the wafer stage 45, with a desired helium gas ambience. Denoted at 51 and 52 are piping spools for coupling the mirror chamber 23 with the helium chamber 50, i.e., the aligner main body 40, while retaining the respective ambiences. Denoted at 53 is a bellows for flexibly coupling the mirror chamber 23 with the aligner main body 40, and denoted at 54 is a beryllium window effective to transmit the illumination light 16 but to isolate the vacuum ambience in the mirror chamber 23 from the helium ambience in the helium chamber 50. At the mirror chamber 23 side of the beryllium window 54, there are provided X-ray intensity detectors 61 for detection of illumination light, which detectors are disposed above and below the illumination light 16 so as not to block the illumination light 16 directed to the exposure zone.

Figure 2:
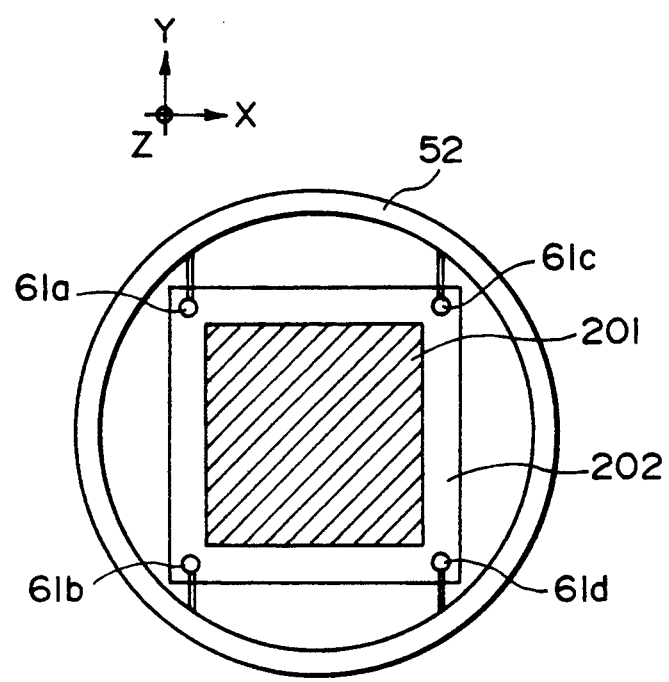
FIG. 2 is a schematic representation, illustrating the positional relationship among an illumination light, an exposure zone and X-ray intensity detectors, in the aligner of FIG. 1.

FIG. 2 illustrates the positional relationship among the illumination light 16, the exposure zone and the X-ray intensity detectors 61, in the aligner of FIG. 1. In FIG. 2, denoted at 201 is the exposure zone and denoted at 202 is an X-ray detecting zone. The illumination light 16 illuminates such a range that includes both the exposure zone 201 and the X-ray detecting zone 202. As illustrated, at four corners of the region which is outside the exposure zone 201 but which is inside the X-ray detecting zone 202, four X-ray intensity detectors 61 (61a, 61b, 61c and 61d) are provided, each at one corner.

Referring back to FIG. 1, denoted at 62 is an X-ray intensity detecting circuit means which is operable to prepare X-ray intensity information on the basis of the outputs of the four X-ray intensity detectors 61. Denoted at 63 is an X-ray intensity attenuation calculating means for executing the computation in accordance with equation (3) or (5), as described, on the basis of the output of the X-ray intensity detecting circuit means 62, to thereby calculate the quantity f(t) of attenuation of the X-ray intensity. Denoted at 64 is a shutter drive table correcting means for correcting the shutter drive table on the basis of the detected X-ray intensity attenuation f(t). Denoted at 65 is a shutter control means for controlling the position or moving speed of the shutter opening at respective time moments, on the basis of the shutter drive table.

Denoted at 66 is a relative positional displacement calculating means for calculating the quantity $\Delta y$ of change in the relative position of the illumination light 16, relative to the aligner main body 40 (i.e., the exposure zone). Denoted at 67 is an aligner position control means which is operable to adjust the quantity of air supply to each air spring on the basis of the detected quantity $\Delta y$ of the relative positional change, to thereby control the attitude of the aligner main body 40 so as to minimize the quantity $\Delta y$ of change in position. Denoted at 68 are air quantity adjusting mechanisms for the air springs.

Figure 3:
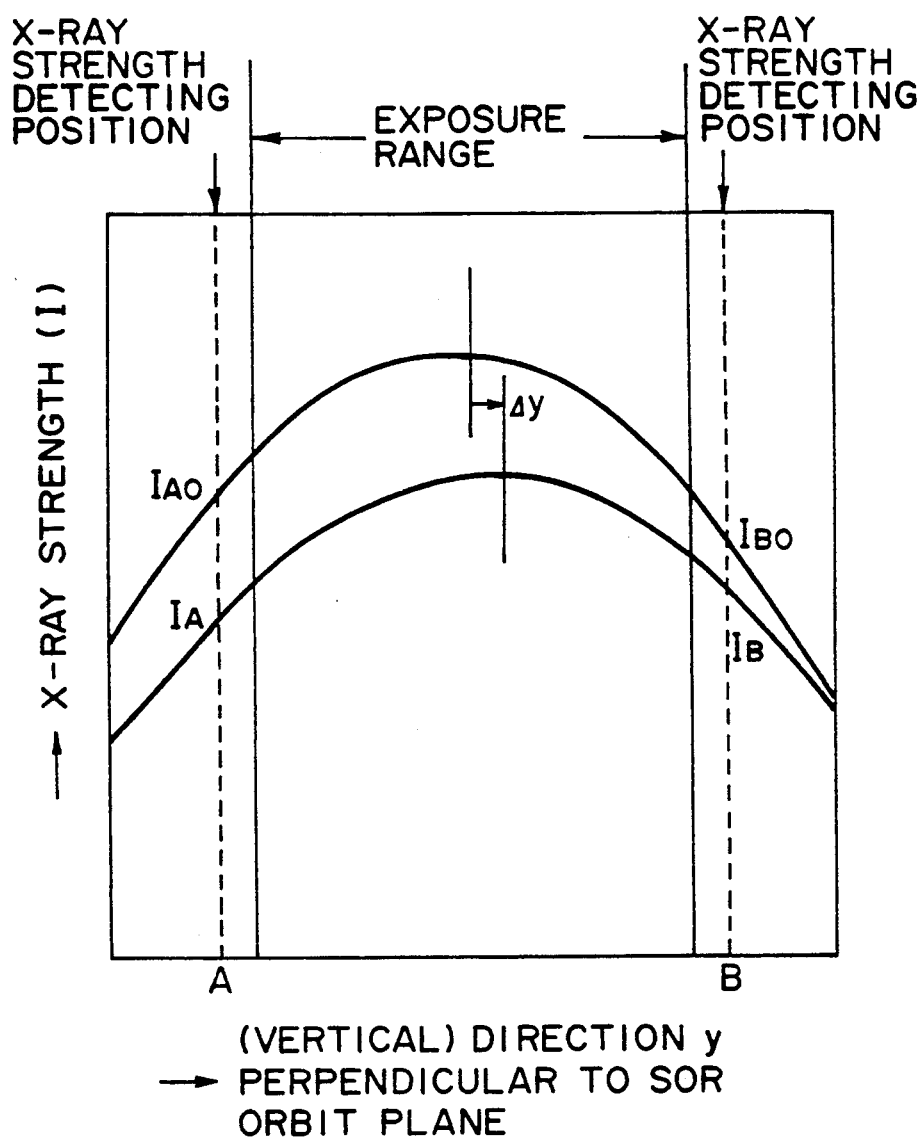
FIG. 3 is a representation showing an exemplary X-ray profile.

In the aligner of FIG. 1, first, an X-ray illuminomitor (not shown) mounted on a carriage (not shown) is scanningly moved in the exposure zone 202 along the y-axis direction, to prepare an illuminance profile such as shown in FIG. 3. At the time of this profile preparation, the X-ray intensity detecting means 62 reads the outputs of the X-ray intensity detectors 61a–61d and produces information corresponding to the respective detection outputs. The X-ray intensity attenuation calculating means 63 and the relative positional change calculating means 66 calculate an average of the detection outputs of the x-ray intensity detectors 61a and 61c as well as an average of the detection outputs of the detectors 61b and 61d, and memorize them as the above-described values $I_{A0}$ and $I_{B0}$, respectively. It is to be noted here that the outputs of the paired X-ray intensity detectors 61a and 61c as well as the outputs of the paired detectors 61b and 61d are calibrated beforehand so that the outputs of the paired detectors are at the same level when the attitude of the aligner main body 40 is set exactly at its standard state.

During the exposure step, the X-ray intensity detecting means 62 reads the outputs of the X-ray intensity detectors 61a–61d as desired, such as at a time immediately before the execution of exposure of a first shot area of each wafer, while on the other hand, the X-ray intensity attenuation calculating means 63 and the relative positional change calculating means 66 calculate the attenuation quantity f(t) and the relative positional change quantity $\Delta y$ on the basis of the detected information and the values $I_{A0}$ and $I_{B0}$.

Figure 4:
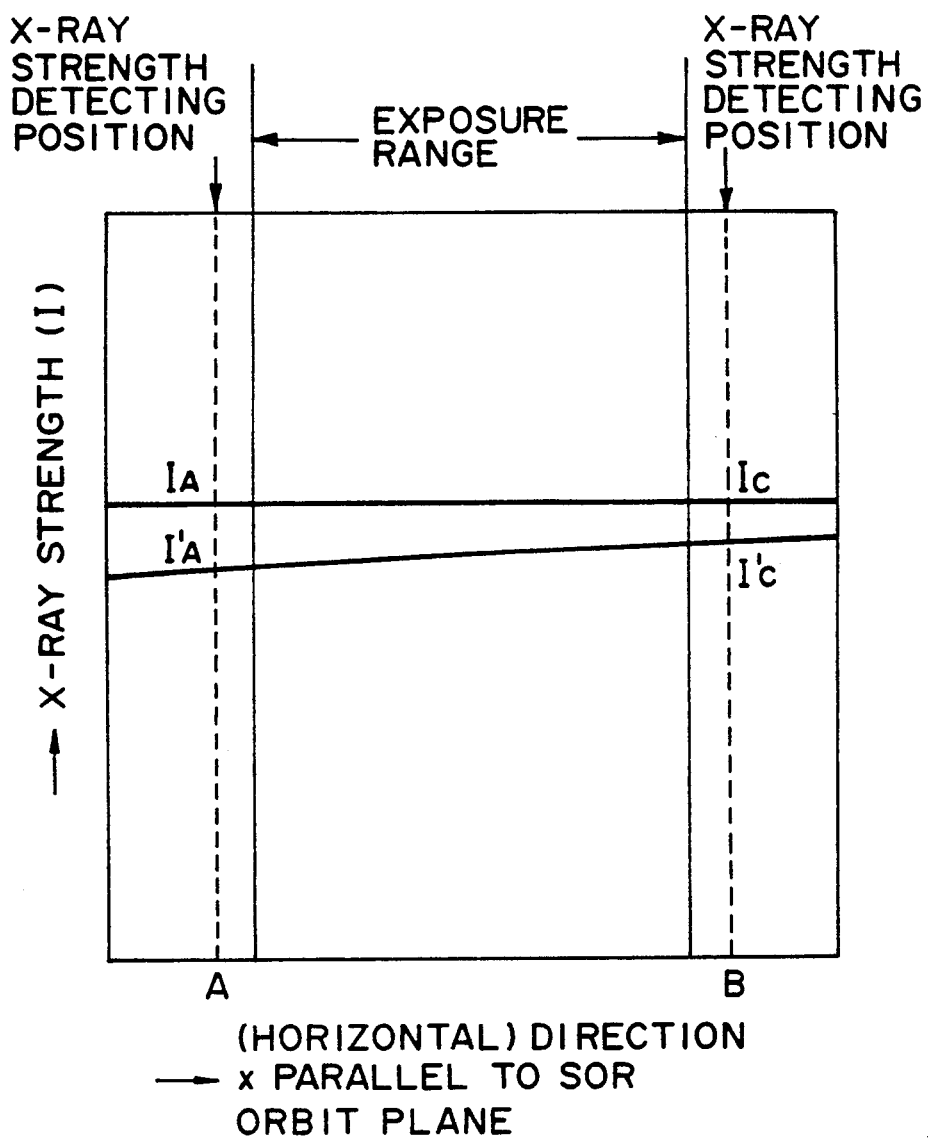
FIG. 4 is a representation, for explaining the principle of detecting the deviation between illumination light and an exposure zone, about an optical axis.

If, on the other hand, the illumination light 16 is rotationally deviated about the z axis (the optical axis of the illumination light 16) relative to the exposure zone 201, as seen in FIG. 4 there is a difference between the outputs of the X-ray intensity detectors 61a and 61c. Also, there is a difference between the outputs of the detectors 61b and 61d. Thus, on the basis of a difference between (i) the average of the detection outputs of the detectors 61a and 61b and (ii) the average of the detection outputs of the detectors 61c and 61d, the relative positional change calculating means 66 also operates to calculate the rotational deviation $\Delta wz$ about the z axis.

The shutter drive table correcting means 64 corrects the shutter drive table on the basis of the X-ray intensity attenuation quantity f(t), and the shutter control means 65 controls the exposure time on the basis of the shutter drive table. By this, even if the X-ray intensity changes due to attenuation or the like, it is possible to correct the exposure amount accurately. Further, the aligner position control means 67 adjusts the quantity of air supply to each air spring on the basis of the relative positional change $\Delta y$ and rotational deviation $\Delta wz$, to thereby control the attitude of the aligner main body 40. By this, the relative position of the illumination light 16 and the aligner main body 40, namely, the exposure zone, can be maintained constant and, therefore, the condition for exposure of each wafer can be retained constantly to minimize the transfer error.

Figure 5:
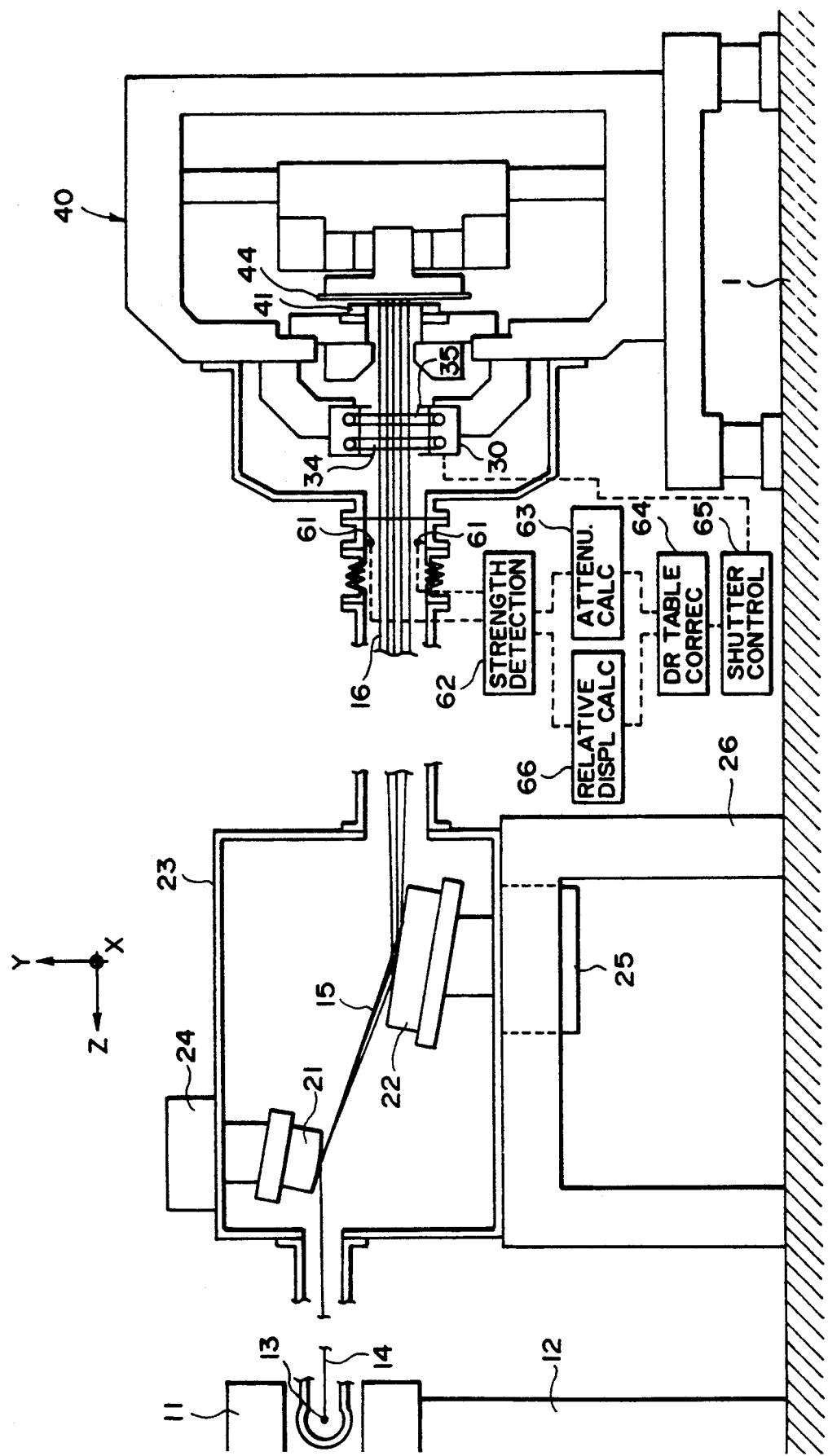
FIG. 5 is a schematic and diagrammatic view of an X-ray aligner according to another embodiment of the present invention.
Figures 15A, 15B, 15C:
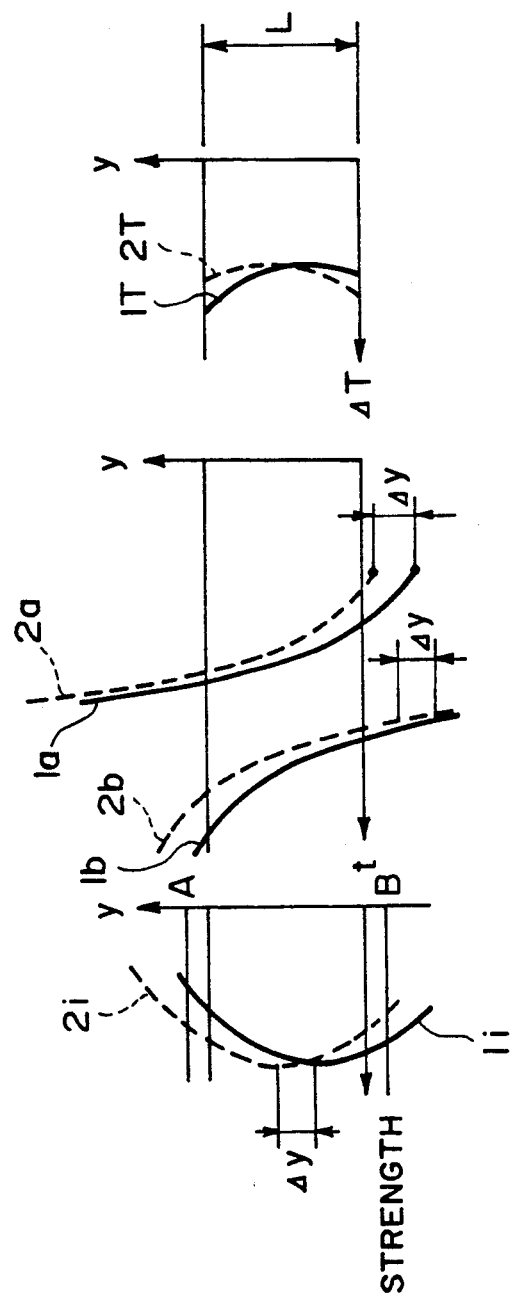

FIG. 5 illustrates the structure of an X-ray aligner according to a second embodiment of the present invention. In the aligner of this example, the positional reference for each of the shutter films 34 and 35 is shifted in the y-axis direction by the quantity $\Delta y$ of the change in the relative position of the illumination light, to thereby attain uniformness in the amount of exposure over the exposure zone 201. More specifically, as seen in FIG. 15A, a deviation $\Delta y$ of a current profile 2i with respect to a reference profile 1i resulting from the change $\Delta y$ in the relative position is compensated by shifting the respective positional references of the shutter films 34 and 35 in the y-axis direction as seen in FIG. 15B, to thereby shift the leading edge 1a position of the shutter opening to the position at 2a and to shift the trailing edge 1b position to the position at 2b, each by an amount $\Delta y$. As a result, the time from the passage of the leading edge 2a of the shutter opening to the passage of the trailing edge 2b thereof, is shifted to "2T" as seen in FIG. 15C, in accordance with the quantity of shift of the profile 2i, whereby a uniform exposure amount is attained throughout the exposure zone 201. Since the aligner of FIG. 5 is arranged so that the shutter drive table 64 is corrected on the basis of both the X-ray intensity attenuation calculating means 63 and the relative positional change calculating means 66, as compared with the FIG. 1 embodiment, it is not necessary to use the aligner position control means 67 or the air supply adjusting means 68, for correction of the amount $\Delta y$. Thus, in such an aligner which is not equipped with these mechanisms, there is an effect of simplification of the structure. However, in the aligner of FIG. 5, the runout error is not corrected.

Figure 6:
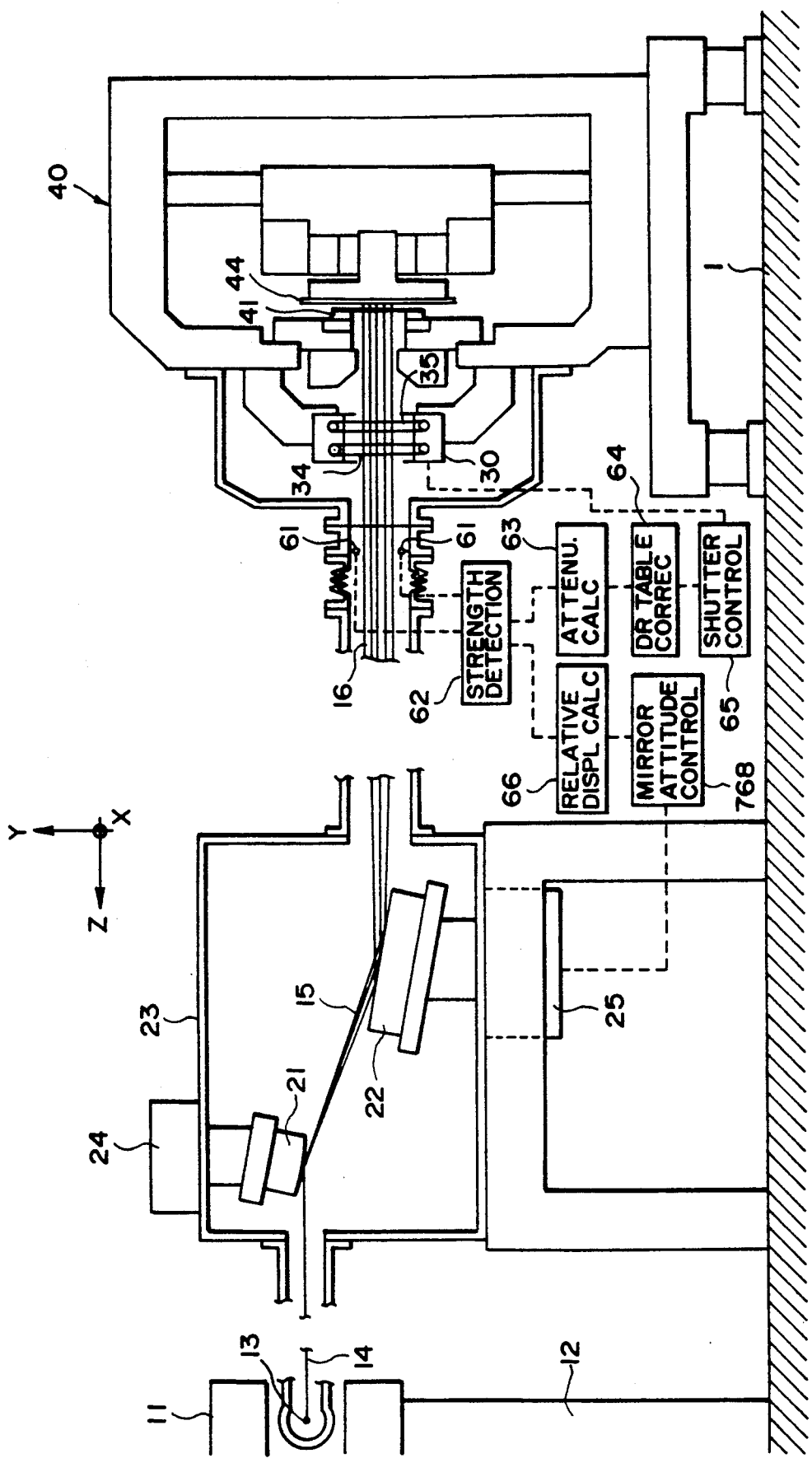
FIGS. 6–14 are schematic and diagrammatic views, respectively, showing X-ray aligners according to further embodiments of the present invention

FIG. 6 shows the structure of a third embodiment of the present invention. In the aligner of this example, the relative positional displacement $\Delta y$ as well as the rotational deviation $\Delta wz$ are compensated for by controlling the attitude of the second mirror 22, to thereby attain uniform exposure. In place of the aligner position control means 67 of the FIG. 1 embodiment, the present embodiment is equipped with a mirror attitude control means 768 for controlling the second mirror driving device 25. In this case, there is a possibility of simplification of the structure. However, the runout error is not corrected.

Figure 7:
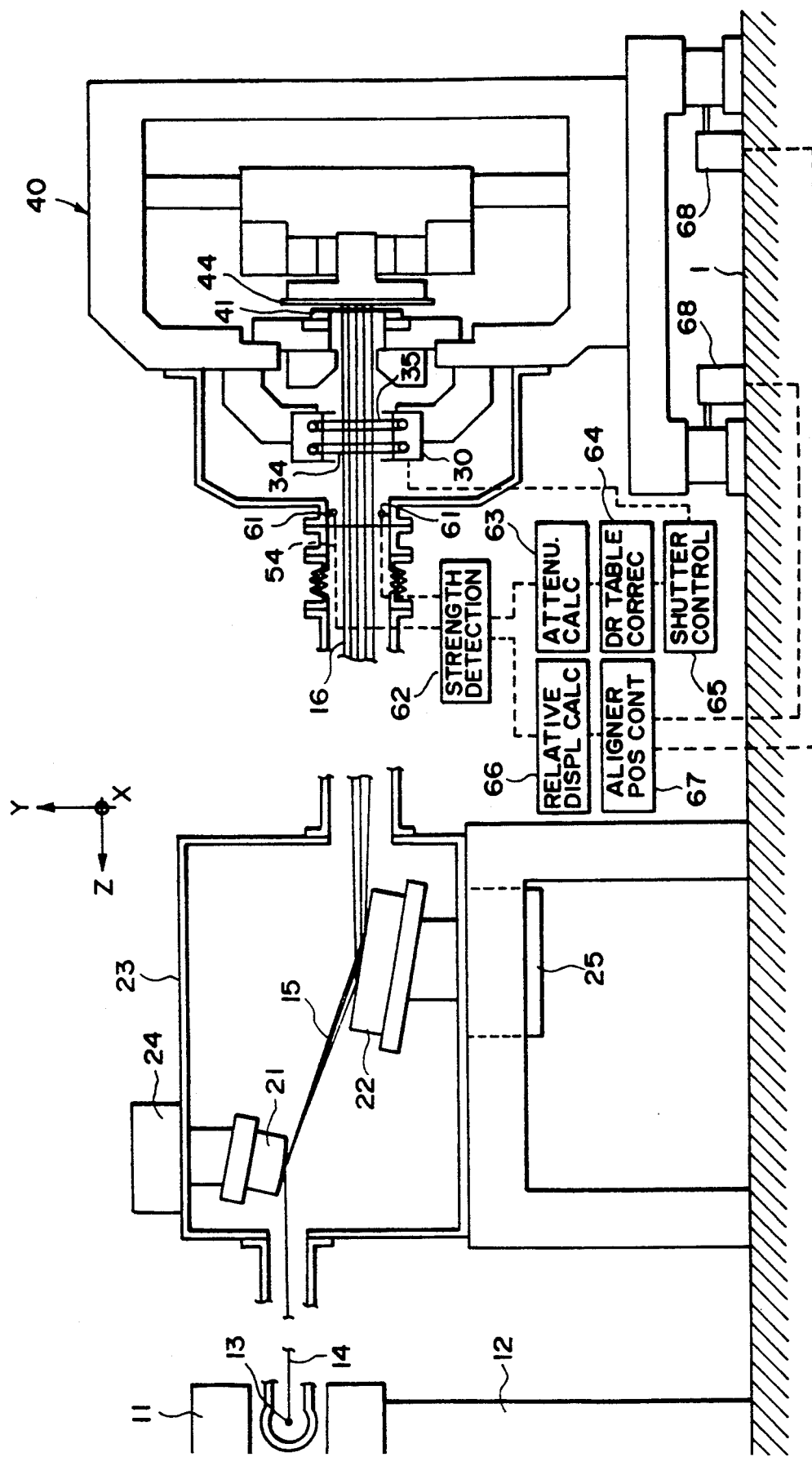

FIG. 7 shows a fourth embodiment of the present invention. The aligner of this example has the same structure as the aligner of FIG. 1, except that the X-ray intensity detectors 61 are disposed at the aligner main body 40 side of the beryllium window 54. Since in the aligner of FIG. 1 the X-ray intensity detectors 61 are disposed in a ultra-high vacuum, improved lifetime of the detector can be expected. On the other hand, since in the aligner of FIG. 7 the visible light is intercepted by the beryllium window 54, improved detection precision of the detector 61 can be expected.

In the aligners of FIGS. 5 and 6, like the FIG. 7 embodiment, the X-ray intensity detectors 61 may be disposed at the aligner main body 40 side of the beryllium window 54.

Figure 8:
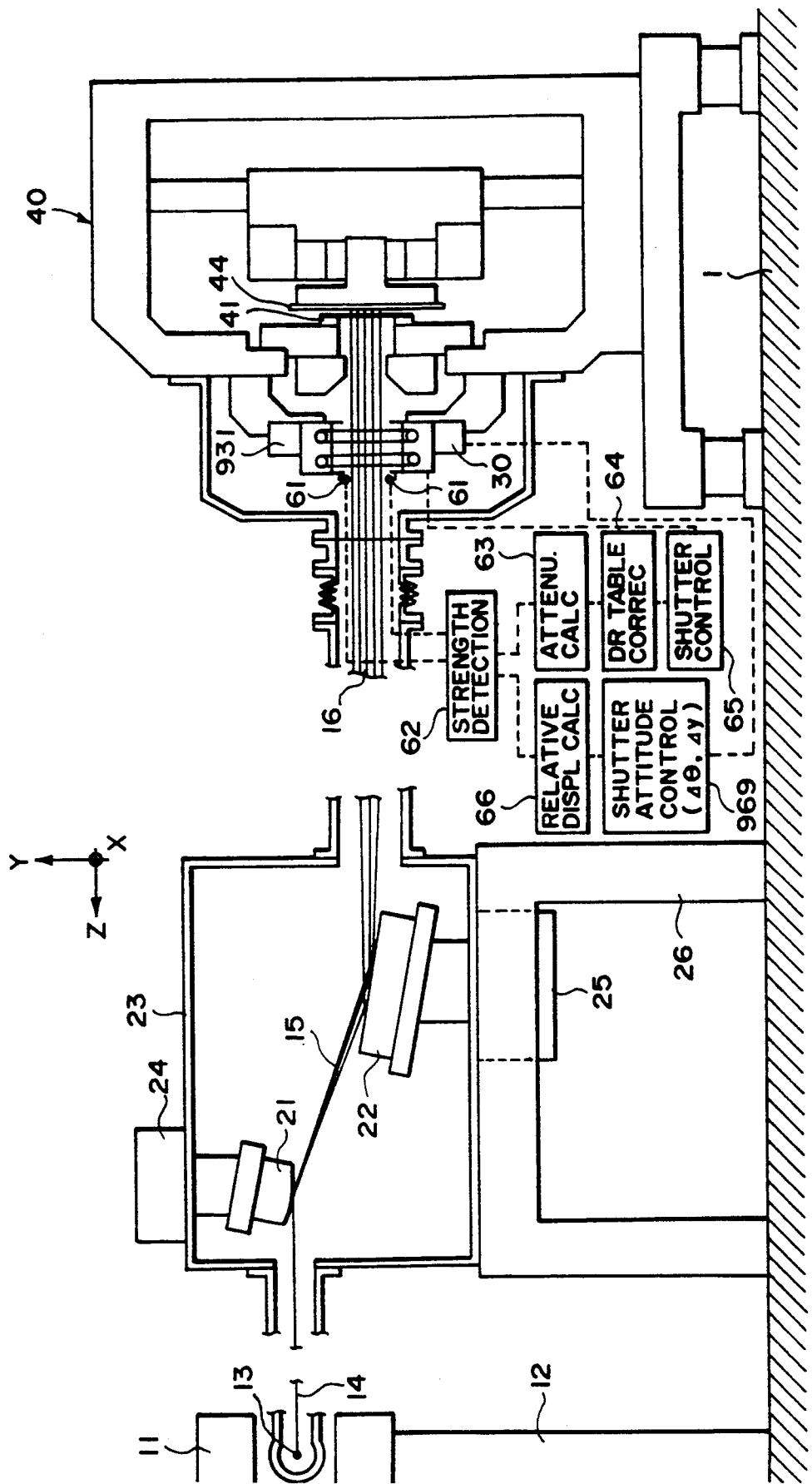

FIG. 8 shows a fifth embodiment of the present invention. In the aligner of this example, the shutter unit 30 is mounted to the shutter stay 31 with the intervention of a shutter attitude control device 931, and the X-ray intensity detectors 61 are disposed on the shutter unit 30. Also, in place of the mirror attitude control means 768 of FIG. 6, there is provided a shutter attitude control means 969 which is operable to drive the shutter attitude control device 931 on the basis of the relative positional change $\Delta y$ and the rotational deviation $\Delta \theta$ ($\Delta wz$) detected by the relative positional change calculating means 66. In the aligner of FIG. 8, the shutter attitude control device 931 causes rotational movement of the shutter unit 30 about the optical axis (z axis) or vertical movement thereof in the y-axis direction, on the basis of the relative positional displacement $\Delta y$ and the rotational deviation $\Delta \theta$. Like the aligners of FIGS. 5 and 6, this makes it possible to attain uniform exposure in the exposure zone 201.

Figure 9:
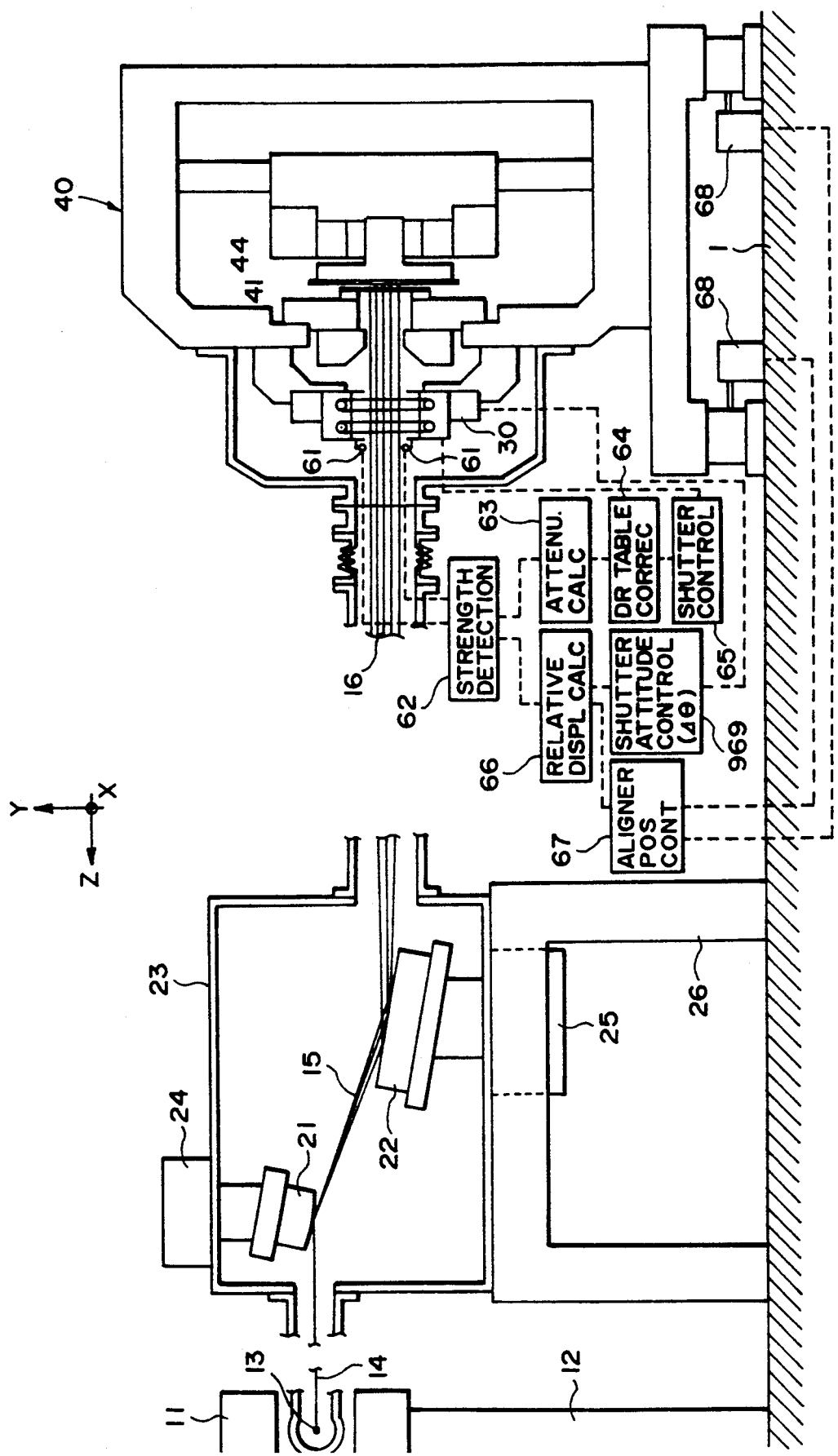

FIG. 9 shows a sixth embodiment of the present invention. As compared with the FIG. 8 embodiment, the aligner of this example is equipped with an aligner main body control means 67 as well as air quantity adjusting mechanisms 68 for air springs, such that the displacement $\Delta y$ can be compensated for by vertically moving the aligner main body 40 while the deviation $\Delta \theta$ can be compensated for by rotationally moving the shutter unit 30 about the optical axis. In the aligner of FIG. 9, like that of FIG. 1, both the attainment of uniform exposure and the prevention of runout error are possible.

Figure 10:
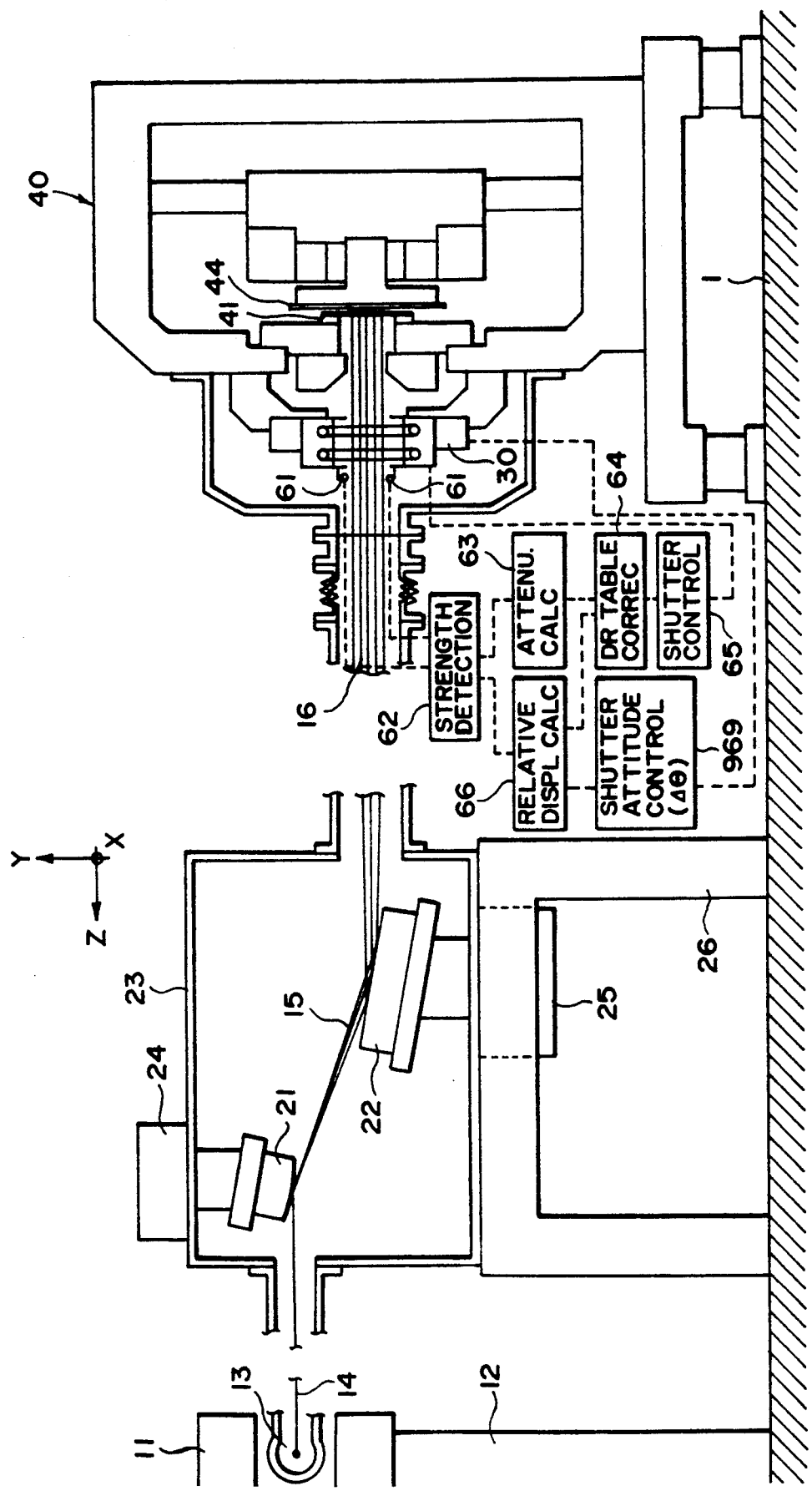

FIG. 10 shows a seventh embodiment of the present invention. In the aligner of this example, as compared with the FIG. 9 embodiment, the aligner main body control means 67 and the air quantity adjusting mechanisms are omitted, such that like the aligner of FIG. 5 the displacement $\Delta y$ is compensated for by shifting the positional references of the shutter films 34 and 35. The advantages and disadvantages of the aligner of FIG. 10 in comparison with the aligner of FIG. 9, are the same as those of the aligner of FIG. 5 in comparison with the aligner of FIG. 1.

Figure 11:
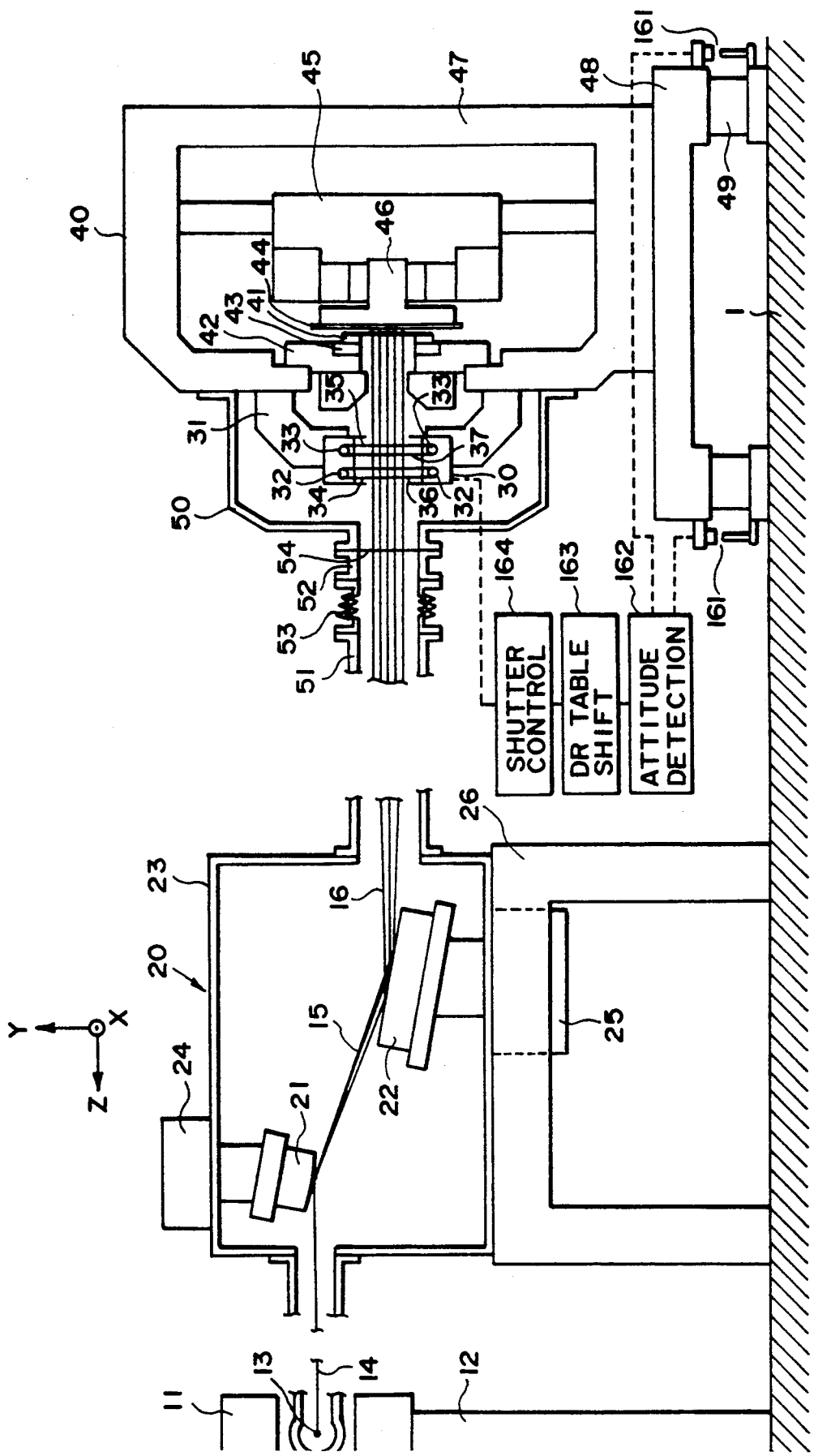

Referring now to FIG. 11 showing an X-ray aligner according to an eighth embodiment of the present invention, reference numeral 11 denotes an SOR device which is placed on a table 12 and which is adapted to emit X-rays 14 from an emission point 13. Denoted at 21 is a first mirror having a convex-shaped reflection surface for expanding the flux of SOR X-rays 14, having a shape of sheet beam elongated in the x-axis (horizontal direction), in the y-axis (vertical) direction. Denoted at 22 is a second mirror for reflecting the X-ray flux 15 divergently emanating from the first mirror 21, so that its central axis extends horizontally. The X-ray flux reflected by the second mirror 22 is inputted to an aligner main body 40 as an illumination light 16 to be used for exposure. Denoted at 23 is a mirror chamber for surrounding the first mirror 21 and the second mirror 22 with a desired vacuum ambience; at 24 is a first mirror driving device which is used for adjustment of the attitude of the first mirror 21; at 25 is a second mirror driving device which is used for adjustment of the attitude of the second mirror 22; and at 26 is a mirror support for supporting a mirror unit 20 which comprises first and second mirrors 21 and 22 as well as the first and second mirror driving devices 24 and 25.

Denoted at 30 is a shutter unit which comprises a shutter stay 31 and shutter shafts 32 and 33 mounted to the shutter stay 31, as well as shutter films 34 and 35 stretched between the shutter shafts 32—32 and between the shutter shafts 33—33, respectively. The shutter films 34 and 35 are provided by endless steel (SUS) belt members formed with rectangular openings (shutter apertures) 36 and 37 having sides each being longer than the size of the exposure zone.

Denoted at 40 is an aligner main body; at 41 is a mask on which a pattern, to be transferred is formed by using an X-ray non-transmissible material such as gold; at 42 is a movable mask stage for carrying thereon the mask 41; at 43 is a mask chuck for holding the mask 41 on the mask stage 42; at 44 is a wafer onto which an image of the mask 41 is to be transferred; at 45 is a movable wafer stage for carrying thereon the wafer 44; at 46 is a wafer chuck for holding the wafer 44 on the wafer stage 45; at 47 is an aligner frame to which the mask stage 42 and the wafer stage 45, for example, are mounted; at 48 is an aligner base on which the aligner frame 47 is placed; at 49 are air springs for supporting the aligner base 48 on a floor 1; and at 61 are non-contact displacement gauges for detecting any change in the position of the aligner main body 40 with respect to the floor 1. The aligner base 48 is supported at least at three points by means of at least three air springs 49. Also, each of the non-contact displacement gauges 161 is effective to measure a displacement of the aligner base 48 at a corresponding one of the three or more points and to detect a change in height of the aligner main body 40 with respect to the floor 1.

Denoted at 50 is a helium chamber for surrounding the stutter unit 30 and the mask 41, placed on the mask stage 42, as well as the wafer 44 placed on the wafer stage 45, with a desired helium gas ambience. Also, denoted at 51 and 52 are piping spools for coupling the mirror chamber 23 with the helium chamber 50, i.e., the aligner main body 40, while retaining the respective ambiences. Denoted at 53 is a bellows for flexibly coupling the mirror chamber 23 with the aligner main body 40, and denoted at 54 is a beryllium window which is effective to transmit the illumination light 16 but to isolate the vacuum ambience in the mirror chamber 23 from the helium ambience in the helium chamber 50.

Denoted at 162 is an attitude detecting means for detecting the attitude of the aligner main body 40 on the basis of the outputs of the non-contact displacement gauges 161. Denoted at 163 is a drive table shifting means for correctively shifting a shutter drive table (not shown) on the basis of the output of the attitude detecting means 162. Denoted at 164 is a shutter control means for controlling the position or moving speed of the shutter aperture 36 or 37 at respective time moments on the basis of the drive table.

In the aligner of FIG. 11, first, an X-ray illuminomitor (not shown) mounted to a carriage (not shown) is scanningly moved in the exposure zone along the y-axis direction, to thereby prepare a profile (illumination light intensity distribution curve) as depicted in FIG. 15A. At the time of this profile preparation, the attitude detecting means 162 reads the outputs of the non-contact displacement gauges 161 and memorizes the attitude of the aligner main body 40 at that time. Also, in this profile preparing operation, drive data for the shutter apertures 36 and 37 corresponding to the prepared profile and being suited to attain uniform exposure throughout the exposure zone, is calculated and memorized into the shutter drive table.

During the exposure step, the attitude detecting means 162 reads the outputs of the non-contact displacement gauges 161 as desired, such as a timing immediately before execution of exposure of a first shot area of each wafer, and the attitude detecting means compares the read values with the memorized data to detect a change $\Delta y$ in attitude of the aligner main body 40 relative to the floor 1. The drive table shifting means 163 is operable to correct the shutter drive table on the basis of the attitude change $\Delta y$ detected by the attitude detecting means 162. This correction is executing by shifting the shutter drive table as seen in FIG. 15B. The shutter control means 164 controls the position or moving speed of each shutter aperture 36 or 37 at respective time moments, on the basis of the shutter drive table.

This ensures that, in response to a deviation $\Delta y$ (FIG. 15A) of a current profile 2$i$ (broken line) with respect to a reference profile 1$i$ (solid line) attributable to a change $\Delta y$ in attitude (height) of the aligner main body 40, the positional references of the shutter apertures 36 and 37 are shifted such that, as seen in FIG. 15B, the leading edge 1$a$ position of the shutter aperture is shifted to the position at 2$a$ while the trailing edge 1$b$ position is shifted to the position at 2$b$, each by an amount $\Delta y$. Thus, the time from the passage of the leading edge 2$a$ of the shutter aperture to the passage of the trailing edge 2$b$ thereof, is shifted in accordance with the quantity of shift of the profile 2$i$, as seen in FIG. 15C, whereby uniform exposure throughout the exposure zone is attained.

Figure 12:
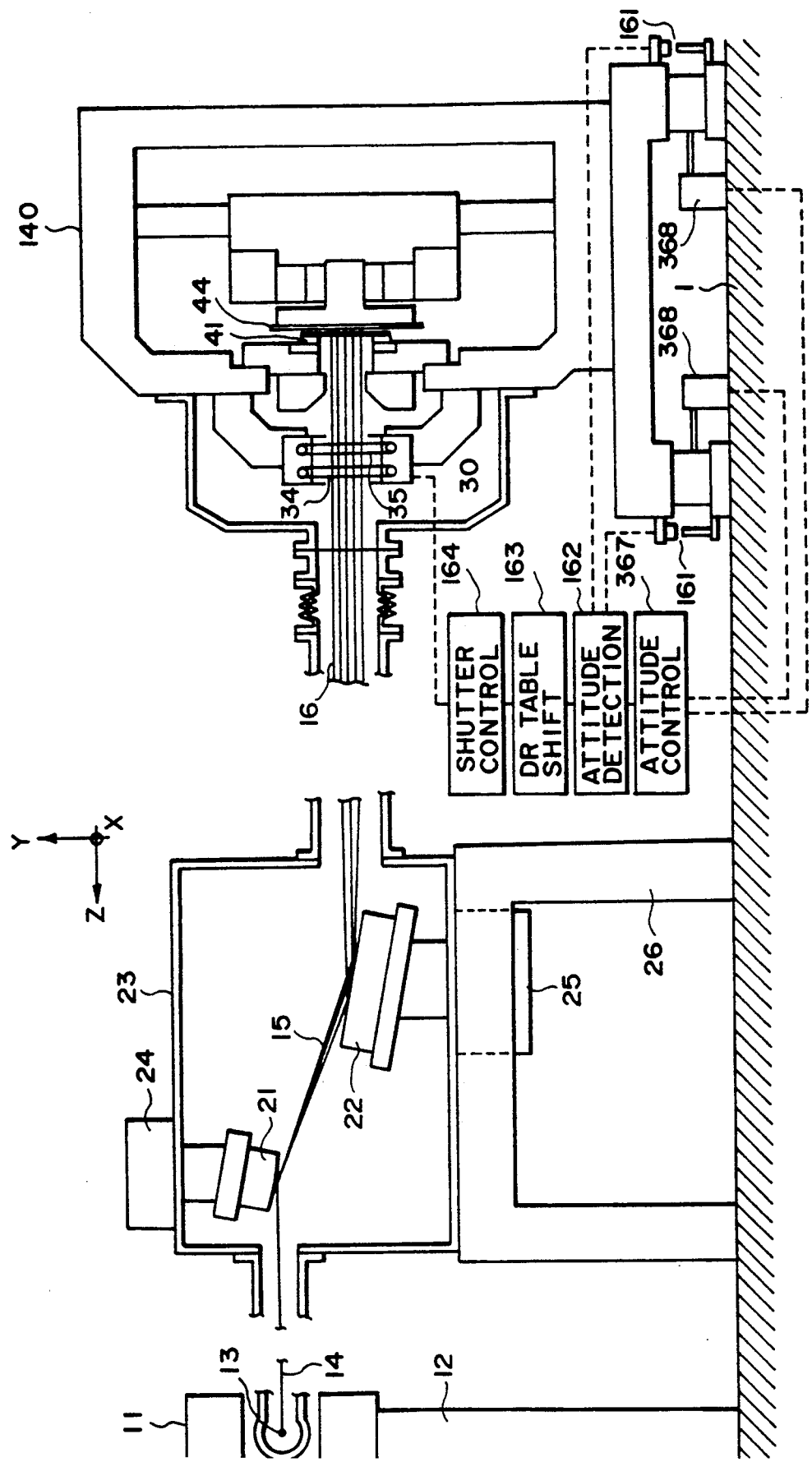

FIG. 12 shows the structure of an X-ray aligner according to a ninth embodiment of the present invention. In the aligner of this example, as compared with the FIG. 11 embodiment, an attitude control means 367 and air quantity adjusting mechanisms 368 for the air springs, are added. Also, the attitude detecting means 162 is arranged to detect not only the attitude change $\Delta y$ in the y-axis (vertical direction) but also a change $\Delta wz$ about the z axis (optical axis of illumination) and a change $\Delta wx$ about the z axis as well as a change $\Delta wy$ about the y axis. The correction of errors $\Delta wx$, $\Delta wy$ and $\Delta wz$ as well as rough correction of the change $\Delta y$, are executed by controlling the attitude of the aligner main body 40 through the attitude control means 367 and the air quantity adjusting mechanisms 368. On the other hand, the fine correction of the change $\Delta y$ is executed by shifting the shutter drive table, like the aligner of FIG. 11.

If only the positional references of the shutter apertures 36 and 37 are shifted for correction, such as in the aligner of FIG. 11, the affect on the exposure distribution of the attitude change $\Delta y$ in the y-axis direction can be corrected. However, a change $\Delta \theta$ in the angle of incidence of the illumination light with respect to the exposure zone is not corrected and, therefore, the registration error $\Delta \delta$ is not corrected completely. Since in the aligner of FIG. 12, correction is also made to the errors $\Delta wx$, $\Delta wy$ and $\Delta wz$, the registration error $\Delta \delta$ is corrected and, thus, the transfer precision is improved.

Figure 13:
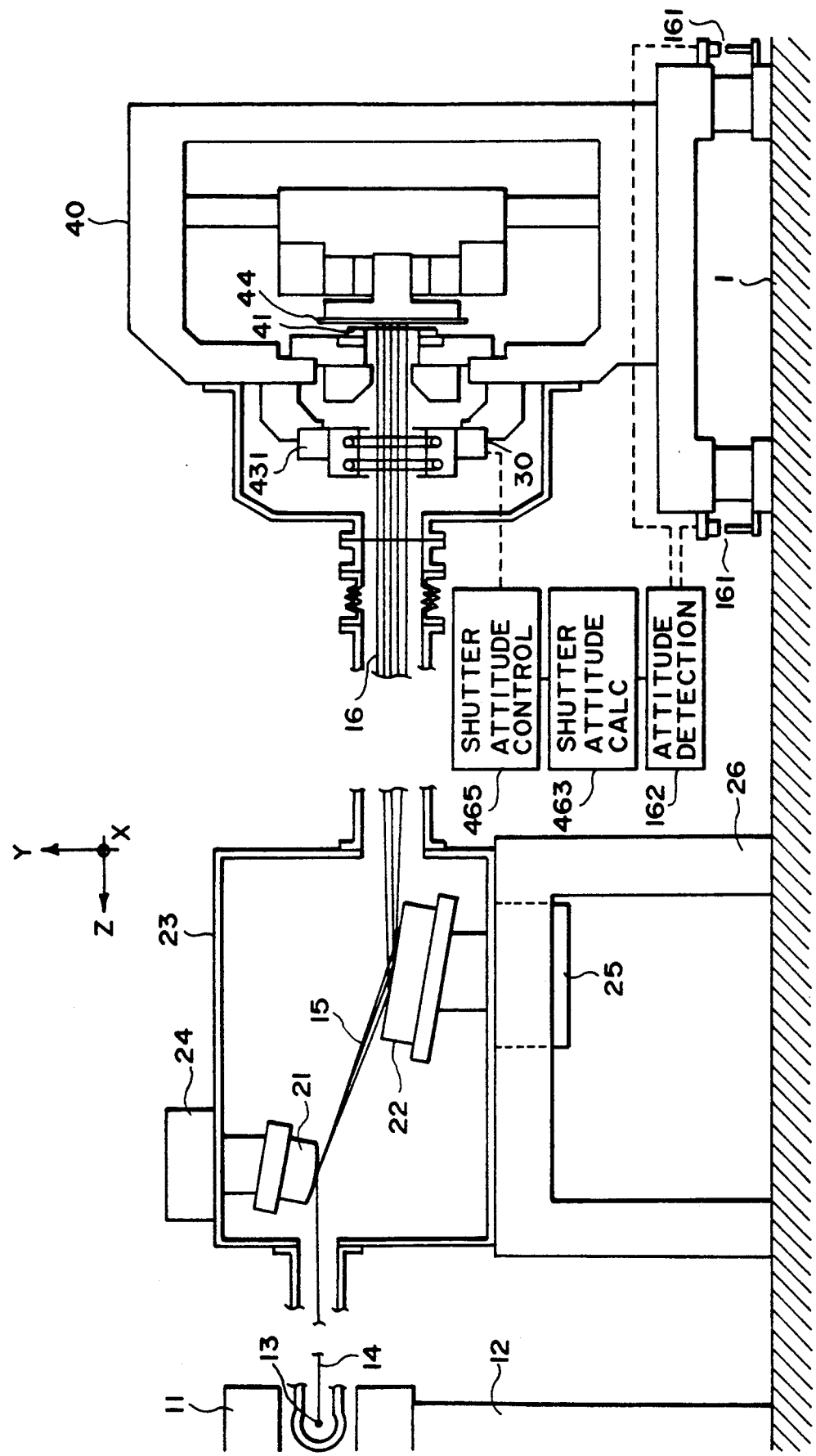

FIG. 13 shows a tenth embodiment of the present invention. In the aligner of this example, as compared with the FIG. 11 embodiment, the shutter unit 30 is mounted to the shutter stay 31 with the intervention of a shutter attitude control device 431, and the attitude detecting means 162 is of the type that detects the errors $\Delta y$ and $\Delta wz$. Also, in place of the drive table shifting means 163 and the shutter control means 164, the aligner is equipped with a shutter attitude calculating means 463 for calculating the shutter attitude on the basis of the aligner main body attitude information from the attitude detecting means 162, as well as a shutter attitude control means 465 which is operable to drive the shutter attitude control device 431 on the basis of such information.

In the aligner of FIG. 13, as compared with the FIG. 11 embodiment, correction is also made to the error $\Delta wz$ and, accordingly, the uniformness in exposure and the precision of registration are better. However, in comparison with the FIG. 12 embodiment, correction of errors $\Delta wx$ and $\Delta wy$ is not effected and, accordingly, the uniformness in exposure and the precision of registration are lower. However, it is only necessary to move the shutter unit 30 which is very light (a few tens of kilograms), in place of moving the aligner main body which is very heavy (a few hundreds of kilograms to a few tons) and, therefore, the structure can be made light and simple.

Figure 14:
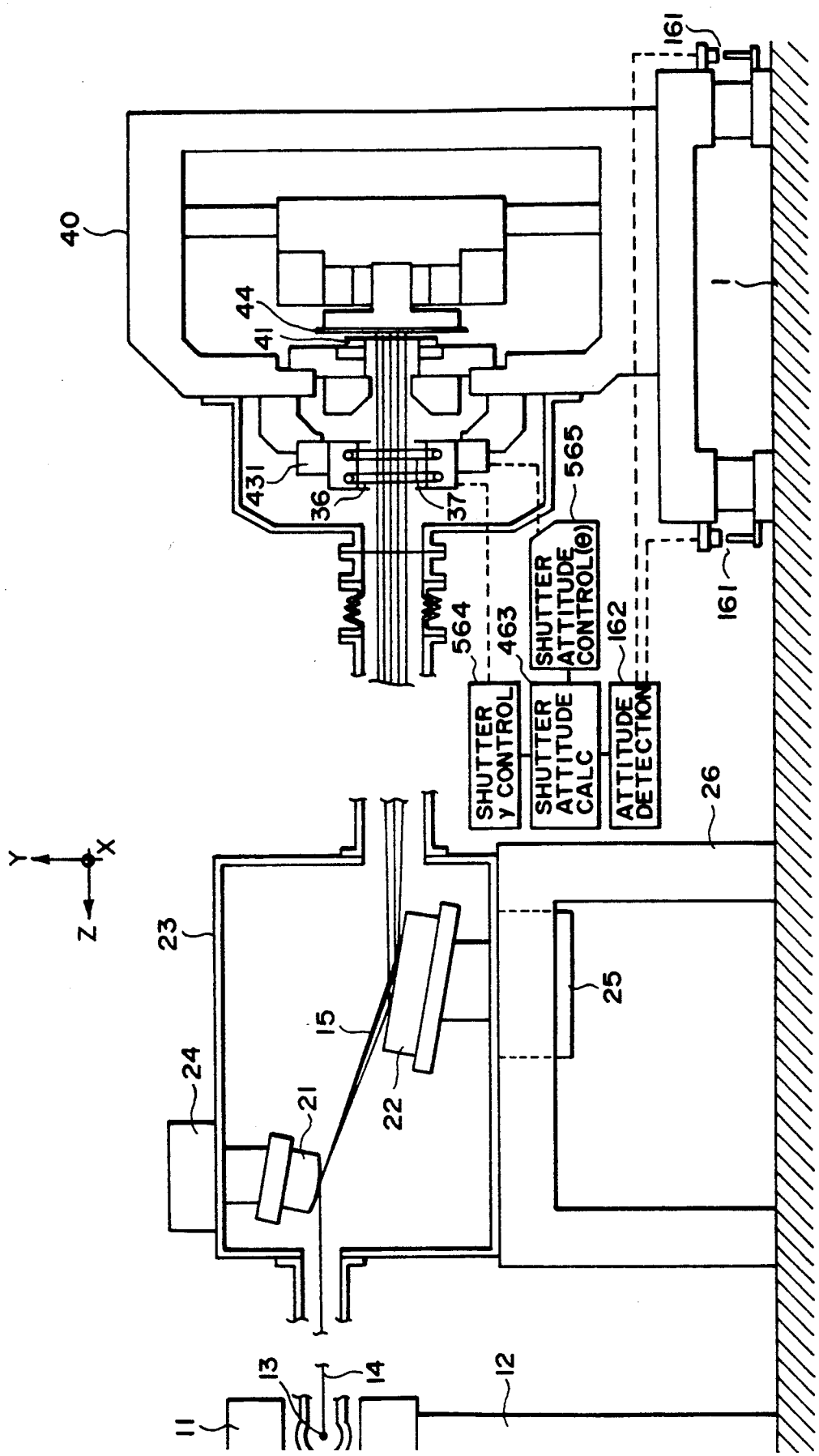

FIG. 14 shows an eleventh embodiment of the present invention. In the aligner of this example, as compared with the FIG. 13 embodiment, a shutter y-control means 564 for executing the positional reference control for the shutter apertures 36 and 37 on the basis of the shutter attitude change information $\Delta y$ from the shutter attitude calculating means 463, is added. Also, the shutter attitude control means 465 is replaced by a shutter attitude control means 565 which operates to correct only the shutter attitude change $\Delta wz$.

In the aligner of FIG. 14, use of the y-axis moving mechanism in the shutter attitude control device 341 of FIG. 13 is not necessary.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing an original and a substrate with a radiation beam including X-rays, for transferring a pattern of the original onto the substrate, said apparatus comprising:
    a radiation source including an SOR device;
    a mirror for projecting a radiation beam from said radiation source along a beam projection path, wherein the radiation beam is projected onto a predetermined cross-sectional irradiation range and the irradiation range includes an exposure zone, the radiation beam passing through the exposure zone to be projected onto the original to illuminate the original;
    beam detectors disposed at different positions in the irradiation range and outside the exposure zone, for detecting the radiation beam projected to the irradiation range, and for producing output signals; and
    detecting means responsive to the output signals from said beam detectors, for detecting a change in intensity of the radiation beam and a change in relative position of the exposure zone and the radiation beam.

2. An apparatus according to claim 1, further comprising exposure control means for controlling the exposure zone.

3. An apparatus according to claim 2, wherein said exposure control means comprises a blocking plate for alternately blocking and transmitting the radiation beam, driving means for driving said blocking plate on the basis of a data table including stored data for determining at least one of the position and moving speed of the blocking plate, and control means for modifying the data in said table on the basis of an output from said detecting means representing a change in relative position.

4. An apparatus according to claim 2, wherein said exposure control means comprises attitude control means for adjusting the positional attitude of a shutter unit, for selectively transmitting and blocking the radiation beam, on the basis of an output from said detecting means representing a change in the relative position, to thereby correct the exposure conditioning.

5. An apparatus according to claim 2, wherein the original and substrate are provided in a main body and said exposure control means comprises attitude control means for adjusting the positional attitude of the main body of said exposure apparatus on the basis of an output from said detecting means representing a change in the relative position of the exposure zone within the radiation beam, to thereby correct the exposure conditions.

6. An apparatus according to claim 2, wherein said exposure control means comprises means for adjusting the attitude of said mirror on the basis of an output from said detecting means representing a change in the relative position, to thereby correct the position of the exposure zone.

7. An apparatus according to claim 2, wherein said exposure control means comprises means for adjusting an electron orbit of said SOR device on the basis of an output from said detecting means representing a change in the relative position.

8. An apparatus according to claim 6, wherein said beam detectors comprise X-ray intensity detectors disposed at two points vertically outside the exposure zone.

9. A semiconductor device manufacturing method comprising the steps of:
    projecting, through reflection by a mirror, a radiation beam containing X-rays from an SOR source along a beam projection path and onto a predetermined irradiation range that includes an exposure zone, the radiation beam passing through the exposure zone to be projected onto a mask to illuminate the mask;
    controlling an exposure period corresponding to non-uniformness of the radiation beam in a one-dimensional direction so as to provide a uniform exposure amount over the exposure zone, by moving a movable shutter plate in accordance with predetermined drive-curve data corresponding to the non-uniformness of the radiation beam;
    shifting the predetermined drive-curve data so as to reduce error attributable to a change in relative position of the exposure zone and the radiation beam; and
    exposing the mask and a wafer with the radiation beam passing through the exposure zone to transfer a pattern of the mask onto the wafer.

10. An exposure apparatus for exposing an original and a substrate with a radiation beam including X-rays, for transferring a pattern of the original onto the substrate, said apparatus comprising:
    a radiation source including an SOR device;
    a mirror for projecting a radiation beam from said radiation source along a beam projection path, wherein the radiation beam is projected onto a predetermined cross-sectional irradiation range and the irradiation range includes an exposure zone, the radiation beam passing through the exposure zone to be projected onto the original to illuminate the original;
    exposure amount controlling means for controlling a time of exposure corresponding to non-uniformness of the radiation beam in a one-dimensional direction, so as to provide a uniform exposure amount over the exposure zone, wherein said exposure amount controlling means comprises a movable shutter plate, and driving means for moving said movable shutter plate in accordance with predetermined drive curve data corresponding to the non-uniformness of intensity; and means for shifting the predetermined drive curve data so as to reduce error attributable to a change in relative position of the exposure zone and the radiation beam.

11. An exposure apparatus for exposing an original and a substrate with a radiation beam including X-rays, for transferring a pattern of the original onto the substrate, said apparatus comprising:

a frame;

a radiation source including an SOR device;

a mirror for projecting a radiation beam from said radiation source along a beam projection path, wherein the radiation beam is projected onto a predetermined cross-sectional irradiation range and the irradiation range include an exposure zone, the radiation beam passing through the exposure zone to be projected onto the original to illuminate the original;

a shutter unit including a movable shutter plate for controlling a time of exposure corresponding to non-uniformness of the radiation beam in a one-dimensional direction, so as to provide a uniform exposure amount over the exposure zone; and position shifting means for shifting a position of said shutter unit, in the one-dimensional direction, with respect to said frame of said exposure apparatus to reduce error attributable to a change in relative position of the exposure zone and the radiation beam.

12. An exposure apparatus according to claim 11, wherein said position shifting means comprises means for rotationally moving said shutter unit about a longitudinal axis of the radiation beam.

13. An exposure apparatus according to claim 11, further comprising a main body including said frame, and means for detecting a relative change in attitude between said main body including said frame and a floor on which said radiation source and said mirror are placed, wherein said position shifting means adjusts the position of said shutter unit in accordance with a detection of the relative attitude change.

14. A semiconductor device manufacturing method comprising the steps of:

projecting, through reflection by a mirror, a radiation beam from an SOR source, containing X-rays, along a beam projection path, such that the radiation beam is projected onto a predetermined irradiation range and the irradiation range includes an exposure zone, the radiation beam passing through the exposure zone to be projected onto a mask to illuminate the mask;

detecting the radiation beam projected to the irradiation range by using detectors placed at positions within the irradiation range and outside the exposure zone, and producing corresponding output signals;

detecting a change in intensity of the radiation beam and a change in relative position of the exposure zone and the radiation beam, on the basis of the output signals from the detectors; and exposing the mask and a wafer with the radiation beam passing through the exposure zone, so as to transfer a pattern of the mask onto the wafer.

15. A method according to claim 14, further comprising the step of controlling the exposure zone.

16. The method according to claim 15, wherein in said exposure control step, a blocking plate is used for alternately blocking and transmitting the radiation beam, the blocking plate being driven on the basis of a data table including stored data for determining at least one of the position and moving speed of the blocking plate, and the data in the table being modified on the basis of an output produced in said change detecting step representing a change in relative position.

17. A method according to claim 15, wherein in said exposure control step the positional attitude of a shutter unit is adjusted, and the radiation beam is selectively transmitted and blocked on the basis of an output produced in said change detecting step representing a change in the relative position to thereby correct the exposure conditioning.

18. A method according to claim 15, wherein the mask and wafer are provided in a main body and in said exposure control step, the positional attitude of the main body is adjusted on the basis of an output produced in said change detecting step representing a change in the relative position of the exposure zone within the radiation beam, to thereby correct the exposure conditions.

19. A method according to claim 15, wherein in said exposure control step the attitude of the mirror is adjusted on the basis of an output produced in said change detecting step representing a change in the relative position, to thereby correct the position of the exposure zone.

20. A method according to claim 15, wherein in said exposure control step an electron orbit of said SOR device is adjusted on the basis of an output produced in said change detecting step representing a change in the relative position.

21. A method according to claim 19, wherein the beam detectors comprise X-ray intensity detectors disposed at two points vertically outside the exposure zone.

22. A semiconductor device manufacturing method comprising the steps of:

projecting, through reflection by a mirror, a radiation beam containing X-rays from an SOR source along a beam projection path and onto a predetermined irradiation range that includes an exposure zone, the radiation beam passing through the exposure zone to be projected onto a mask to illuminate the mask;

controlling the exposure period corresponding to non-uniformness of the radiation beam in a one-dimensional direction so as to provide a uniform exposure amount over the exposure zone, by using a shutter unit including a movable shutter plate;

shifting a position of the shutter unit in the one-dimensional direction so as to reduce error attributable to a change in relative position of the exposure zone and the radiation beam; and exposing the mask and a wafer with the radiation beam passing through the exposure zone to transfer a pattern of the mask onto the wafer.

* * * * *

UNITED STATES PATENT AND TRADEMARK OFFICE
CERTIFICATE OF CORRECTION

PATENT NO. : 5,285,488
DATED : February 8, 1994
INVENTOR(S) : YUTAKA WATANABE ET AL.

It is certified that error appears in the above-indentified patent and that said Letters Patent is hereby corrected as shown below:

Item [30],
ON THE COVER PAGE, col. 2, lines 1 and 10,

UNDER "FOREIGN PATENT DOCUMENTS":

"83394 7/1983 European Pat. Off." (first occurrence) should be deleted; and
"1-243519 1/1989 Japan" should read
--1-243519 9/1989 Japan--.

COLUMN 2:

Line 18, "affect" should read --effect--.

COLUMN 5

Line 34, "$f(t)=[1/(\alpha-\beta)](\alpha_A-\beta i_B)$" should read
--$f(t)=[1/(\alpha-\beta)](\alpha i_A-\beta i_B$--.

COLUMN 8:

Line 8, "illuminomitor" should read --illuminator--.

COLUMN 9:

Line 50, "a" should read --an--.

UNITED STATES PATENT AND TRADEMARK OFFICE
CERTIFICATE OF CORRECTION

PATENT NO. : 5,285,488
DATED : February 8, 1994
INVENTOR(S) : YUTAKA WATANABE ET AL.

It is certified that error appears in the above-indentified patent and that said Letters Patent is hereby corrected as shown below:

COLUMN 10:

Line 39, "sheet" should read --a sheet--; and
    Line 66, "pattern," should read --pattern--.

COLUMN 11:

Line 10, "61" should read --161--;
    Line 21, "stutter" should read --shutter--;
    Line 43, "illuminomi-" should read --illuminator--. and
    Line 44, "tor" should be deleted.

COLUMN 12:

Line 28, "z axis" should read --x axis--; and
    Line 39, "affect" should read --effect--.

COLUMN 14:

Line 2, "conditioning." should read --conditions.--.

COLUMN 15:

Line 19, "include" should read --includes--.

UNITED STATES PATENT AND TRADEMARK OFFICE
CERTIFICATE OF CORRECTION

PATENT NO. : 5,285,488
DATED : February 8, 1994
INVENTOR(S) : YUTAKA WATANABE ET AL.

It is certified that error appears in the above-indentified patent and that said Letters Patent is hereby corrected as shown below:

<u>COLUMN 16</u>:

Line 6, "The" should read --A--;
    Line 20, "position" should read --position,--; and
    Line 21, "conditioning." should read --conditions.--.

Signed and Sealed this

Ninth Day of August, 1994

Attest:

BRUCE LEHMAN

*Attesting Officer*    *Commissioner of Patents and Trademarks*